US006995618B1

(12) United States Patent
Boecker

(10) Patent No.: US 6,995,618 B1
(45) Date of Patent: Feb. 7, 2006

(54) VCO FEEDBACK LOOP TO REDUCE PHASE NOISE

(75) Inventor: Charles W. Boecker, Ames, IA (US)

(73) Assignee: Xilinx, Inc., San Jose, CA (US)

( * ) Notice: Subject to any disclaimer, the term of this patent is extended or adjusted under 35 U.S.C. 154(b) by 131 days.

(21) Appl. No.: 10/660,234

(22) Filed: Sep. 11, 2003

(51) Int. Cl.
*H03L 7/00* (2006.01)

(52) U.S. Cl. ........................ 331/16; 327/101; 327/311; 331/1 A; 331/17; 331/34; 331/57; 331/48; 331/177 R; 331/177 V

(58) Field of Classification Search ................. 331/57, 331/1 A, 16, 17, 34, 48, 177 R, 177 V; 327/311, 327/101
See application file for complete search history.

(56) References Cited

U.S. PATENT DOCUMENTS 4,788,695 A 11/1988 Iverson et al.
5,256,989 A * 10/1993 Parker et al. ............... 331/1 A
6,353,368 B1 * 3/2002 Iravani ........................ 331/57

OTHER PUBLICATIONS

U.S. Appl. No. 10/660,062, filed Sep. 11, 2003, Groen et al.
U.S. Appl. No. 10/660,448, filed Sep. 11, 2003, Groen et al.
U.S. Appl. No. 10/659,803, filed Sep. 11, 2003, Black et al.
U.S. Appl. No. 10/659,971, filed Sep. 11, 2003, Boecker et al.

* cited by examiner

*Primary Examiner*—Michael B Shingleton
(74) *Attorney, Agent, or Firm*—Tim Markison; Kim Kanzaki

(57) ABSTRACT

A phase adjustment module in a voltage controlled oscillator (VCO) samples a VCO oscillation to detect changes in the oscillation frequency and produces a corresponding correction voltage that is feedback to the VCO input to correct the frequency change. A plurality of sampling modules, each formed to start sampling at a different point on the oscillation cycle, charge a sampling module capacitor over the period of a full oscillation cycle. The samples are coupled to a low pass filter to produce a running average of all the samples. The charge on each capacitor is coupled to a first input of a plurality of operational amplifiers and the running average is coupled to a second input. The summed output of the operational amplifiers is substantially equal to a difference between the running average and a voltage representing the instantaneous time change or phase change of the oscillation frequency.

26 Claims, 13 Drawing Sheets

Phase adjustment module 186 programmable logic device 10 programmable MGT 14 - 28 programmable MGT 14 - 28 programmable receive PMA module 40 programmable transmit PMA module 38 phase-locked loop 170

Phase adjustment module 186 sampling module 290 oscillation signal sampling zero crossing sampling

1/4 cycle sampling frequency domain phase noise plot sampling method

VCO FEEDBACK LOOP TO REDUCE PHASE NOISE

BACKGROUND OF THE INVENTION

1. Technical Field of the Invention

This invention relates generally to communication systems and more particularly to clock recovery circuits used therein.

2. Description of Related Art

Communication systems are known to transport large amounts of data between a plurality of end user devices, which, for example, include telephones, facsimile machines, computers, television sets, cellular telephones, personal digital assistants, etc. As is known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), or the Internet. As is further known, communication systems include a plurality of system equipment to facilitate the transporting of data. Such system equipment includes, but is not limited to, routers, switches, bridges, gateways, protocol converters, frame relays, and private branch exchanges.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits per second, 100 megabits per second, 1 gigabit per second and beyond. Synchronous Optical NETwork (SONET), for example, currently provides for transmission of 10 gigabits per second. In accordance with such standards, many system components and end user devices of a communication system transport data via serial transmission paths. Internally, however, the system components and end user devices may process data in a parallel manner. As such, each system component and end user device must receive the serial data and convert the serial data into parallel data without loss of information. After processing the data, the parallel data must be converted back to serial data for transmission without loss.

Accurate recovery of information from high-speed serial transmissions typically requires transceiver components that operate at clock speeds equal to or higher than the received serial data rate. Higher clock speeds limit the usefulness of prior art clock recovery circuits that require precise alignment of signals to recover clock and/or data. Higher data rates require greater bandwidth for a feedback loop of the clock recovery circuits to operate correctly. Some prior art designs are bandwidth limited.

As the demand for data throughput increases, so do the demands on a high-speed serial transceiver. The increased throughput demands are pushing some current integrated circuit manufacturing processes to their operating limits, where integrated circuit processing limits (e.g., device parasitics, trace sizes, propagation delays, device sizes) and integrated circuit (IC) fabrication limits (e.g., IC layout, frequency response of the packaging, frequency response of bonding wires) limit the speed at which the high-speed serial transceiver may operate without excessive phase noise (jitter) performance and/or noise performance.

A further alternative for high-speed serial transceivers is to use an IC technology that inherently provides for greater speeds. For instance, switching from a CMOS process to a silicon germanium or gallium arsenide process would allow integrated circuit transceivers to operate at greater speeds, but at substantially increased manufacturing costs. CMOS is more cost effective and provides easier system integration. Currently, for most commercial-grade applications, including communication systems, such alternate integrated circuit fabrication processes are too cost prohibitive for widespread use.

Modern communication systems, including high data rate communication systems, typically include a plurality of circuit boards that communicate with each other by way of signal traces, bundled data lines, back planes, etc. Accordingly, designers of high data rate communication transceiver devices often have conflicting design goals that relate to the performance of the particular device. For example, there are many different communication protocols specified for data rates that range from 2.48832 gigabits per second for OC48, to 9.95 gigabits per second for OC192. Other known standards define data rates of 2.5 gigabits per second (INFINIBAND) or 3.125 gigabits per second (XAUI). These different data rates affect the allowable rise and fall time of the signal, the peak amplitude of the signal and the response time from an idle state. For example, one protocol may specify a peak voltage range of 200–400 millivolts, while another standard specifies a mutually exclusive voltage range of 500–700 millivolts. Thus, a designer either cannot satisfy these mutually exclusive requirements (and therefore cannot support multiple protocols) or must design a high data rate transceiver device that can adapt according to the protocol being used for the communications.

Along these lines, field programmable gate array (FPGA) circuits are gaining in popularity for providing the required flexibility and adaptable performance described above for those designers that seek to build one device that can operate according to multiple protocols. Thus, while FPGA technology affords a designer an opportunity to develop flexible and configurable hardware circuits, specific designs that achieve the desired operations must still be developed.

One design challenge for serial data processing, especially for high data rate communications, relates to voltage controlled oscillators (VCOs) used in clock and data recovery circuits. More specifically, one design challenge is to identify and substantially correct for the sources of error that contribute to phase noise or jitter in a clock used for transmission and/or data recovery. Phase noise is a term used to describe a phase change in a signal due to a random change in signal frequency. VCO frequency stability or frequency change per unit of time is one source of phase noise and a common source of error in the VCO is the current source used to bias semiconductor devices in the VCO. Semiconductor noise such as 1/f noise and shot noise appears as additional current components thus effectively modulating the bias current produced by the current source and ultimately modulating the VCO frequency. Because 1/f noise and shot noise are a function of semiconductor physics, they can be controlled but not eliminated. A need exists, therefore, for a device and accompanying method to correct for phase noise in voltage controlled oscillators.

BRIEF SUMMARY OF THE INVENTION

A device and a method for reducing phase noise of a voltage controlled oscillator in a phase-locked loop, including a phase adjustment module in the VCO that is operably coupled to receive a VCO oscillation signal and to produce a correction voltage to counteract a phase shift resulting from phase noise in the oscillation signal. The phase adjustment module includes a plurality of sampling modules coupled to receive the oscillation signal, wherein each sampling module samples the oscillation signal over a different time interval to produce a sampled voltage corresponding to a change in the period of the oscillation signal during the time interval. In one embodiment of the present invention, the time intervals start at both a positive going zero crossing and a negative going zero crossing. In a second embodiment of the present invention, the time intervals start at one-quarter cycle points of the oscillation signal.

A sampling logic module in each sampling module receives the oscillating signal from the VCO and receives a plurality of control signals from the phase logic module. Responsive to the plurality of control signals received from the phase logic module, the sampling logic module produces a plurality of signals to functionally control each sampling module. More specifically, a sample signal produced by the sampling logic module operatively closes and opens a switch to charge a capacitor with a current source during a specified time interval of the oscillation signal. The time interval is typically one full cycle of the oscillation signal therefore the capacitor voltage is proportional to the period of oscillation signal. The capacitor voltage is coupled to a sampling amplifier that couples the sampled voltage from the sampling module.

The sampled voltages are further coupled to a variable low pass filter that produces a filtered voltage representing a running average of the sampled voltages. The sampled voltages and the filtered voltage are combined in a plurality of operational amplifiers whose output signals are produced to a summing module that produces a correction voltage to the voltage controlled oscillator.

A change in sampled voltages from the running average represents changes in the oscillator period and, therefore, further represents a change in the oscillation signal per unit of time, or more specifically, represents an oscillation change due to phase noise. Thus, the detected phase noise represented as a voltage value is produced to an input of the VCO to prompt it to adjust its output oscillation in response to the detected phase noise to substantially correct the phase noise.

DETAILED DESCRIPTION OF THE INVENTION

Figure 1:
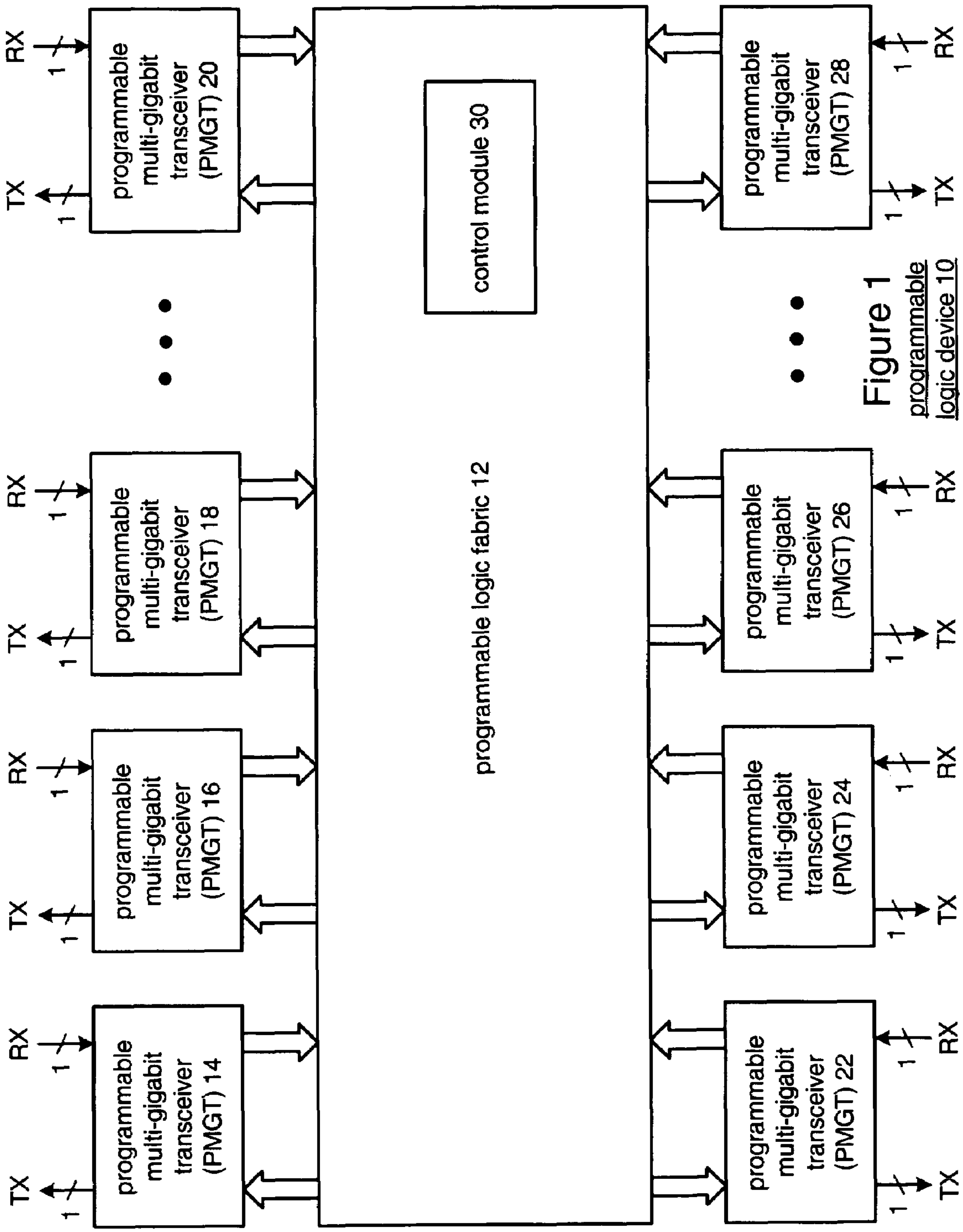
FIG. 1 is a schematic block diagram of a programmable logic device that includes programmable logic fabric, a plurality of programmable multi-gigabit transceivers (PMGTS) and a control module.

FIG. 1 is a schematic block diagram of a programmable logic device 10 that includes programmable logic fabric 12, a plurality of programmable multi-gigabit transceivers (PMGT) 14–28 and a control module 30. The programmable logic device 10 may be programmable logic devices, an erasable programmable logic device, and/or a field programmable gate array (FPGA). When the programmable logic device 10 is an FPGA, the programmable logic fabric 12 may be implemented as a symmetric array configuration, a row-based configuration, a sea-of-gates configuration, and/or a hierarchical programmable logic device configuration. The programmable logic fabric 12 may further include at least one dedicated fixed processor, such as a microprocessor core, to further facilitate the programmable flexibility offered by a programmable logic device 10.

The control module 30 may be contained within the programmable logic fabric 12 or it may be a separate module. In either implementation, the control module 30 generates the control signals to program each of the transmit and receive sections of the PMGTs 14–28. In general, each of the PMGTs 14–28 performs a serial-to-parallel conversion on receive data and performs a parallel-to-serial conversion on transmit data. The parallel data may be, for instance, 8-bits, 16-bits, 32-bits, or 64-bits wide.

Typically, the serial data will be a 1-bit stream of data that may be a binary level signal, multi-level signal, etc. Further, two or more programmable multi-gigabit transceivers may be bonded together to provide greater transmitting speeds. For example, if PMGTs 14, 16 and 18 are transceiving data at 3.125 gigabits per second, the PMGTs 14, 16 and 18 may be bonded together such that the effective serial rate is approximately 3 times 3.125 gigabits per second.

Each of the programmable multi-gigabit transceivers 14–28 may be individually programmed to conform to separate standards. In addition, the transmit path and receive path of each programmable multi-gigabit transceiver 14–28 may be separately programmed such that the transmit path of a transceiver is supporting one standard while the receive path of the same transceiver is supporting a different standard. Further, the serial rates of the transmit path and receive path may be programmed, for example, from 1 gigabit per second to tens of gigabits per second. The size of the parallel data in the transmit and receive sections, or paths, is also programmable and may vary, for instance, may be 8-bits, 16-bits, 32-bits, or 64-bits wide.

Figure 2:
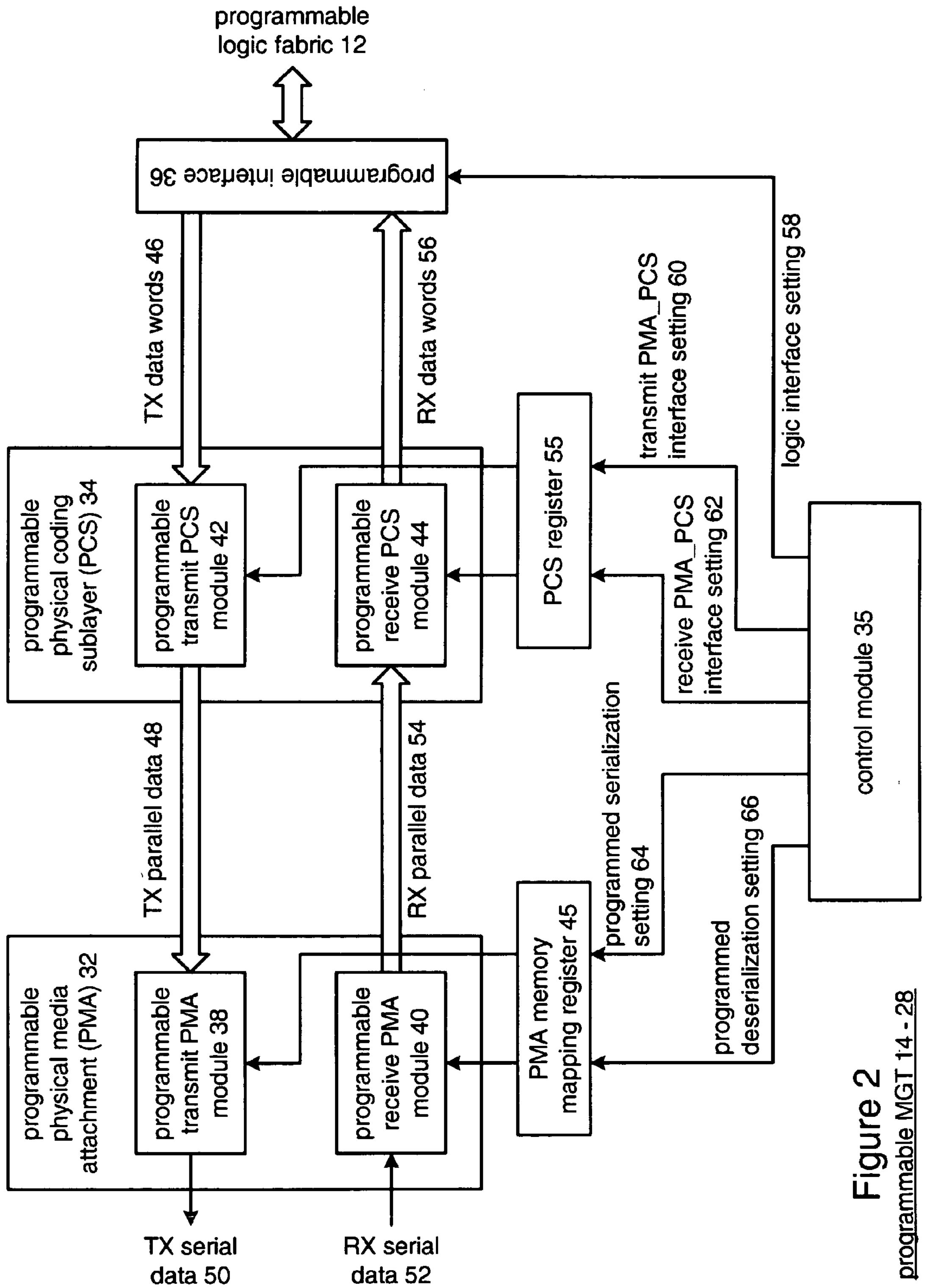
FIG. 2 is a schematic block diagram of one embodiment of a representative one of the programmable multi-gigabit transceivers.

FIG. 2 is a schematic block diagram of one embodiment of a representative one of the programmable multi-gigabit transceivers 14–28. As shown, the programmable multi-gigabit transceiver includes a programmable physical media attachment (PMA) 32, a programmable physical coding sub-layer (PCS) 34, a programmable interface 36, a control module 35, a PMA memory mapping register 45 and a PCS register 55. The control module 35, based on the desired mode of operation for the individual programmable multi-gigabit transceiver 14–28, generates a programmed deserialization setting 66, a programmed serialization setting 64, a receive PMA_PCS interface setting 62, a transmit PMA_PCS interface setting 60, and a logic interface setting 58. The control module 35 may be a separate device within each of the programmable multi-gigabit transceivers or included partially or entirely within the control module 30.

In either embodiment of the control module 35, the programmable logic device control module 30 determines the corresponding overall desired operating conditions for the programmable logic device 10 and provides the corresponding operating parameters for a given programmable multi-gigabit transceiver to its control module 35, which generates the settings 58–66.

The programmable physical media attachment (PMA) 32 includes a programmable transmit PMA module 38 and a programmable receive PMA module 40. The programmable transmit PMA module 38, which will be described in greater detail with reference to FIG. 4B, is operably coupled to convert transmit parallel data 48 into transmit serial data 50 in accordance with the programmed serialization setting 64. The programmed serialization setting 64 indicates the desired rate of the transmit serial data 50, the desired rate of the transmit parallel data 48, and the data width of the transmit parallel data 48. The programmable receive PMA module 40 is operably coupled to convert receive serial data 52 into receive parallel data 54 based on the programmed deserialization setting 66. The programmed deserialization setting 66 indicates the rate of the receive serial data 52, the desired rate of the receive parallel data 54, and the data width of the receive parallel data 54. The PMA memory mapping register 45 may store the programmed serialization setting 64 and the programmed deserialization setting 66.

The programmable physical coding sub-layer (PCS) module 34 includes a programmable transmit PCS module 42 and a programmable receive PCS module 44. The programmable transmit PCS module 42, receives transmit data words 46 from the programmable logic fabric 12 via the programmable interface 36 and converts them into the transmit parallel data 48 in accordance with the transmit PMA_PCS interface setting 60. The transmit PMA_PCS interface setting 60 indicates the rate of the transmit data words 46, the size of the transmit data words (e.g., 1-byte, 2-bytes, 3-bytes, 4-bytes) and the corresponding transmission rate of the transmit parallel data 48. The programmable receive PCS module 44 converts the receive parallel data 54 into receive data words 56 in accordance with the receive PMA_PCS interface setting 62. The receive PMA_PCS interface setting 62 indicates the rate at which the receive parallel data 54 will be received, the width of the receive parallel data 54, the transmit rate of the receive data words 56 and the word size of the receive data words 56.

The control module 35 also generates the logic interface setting 58 that provides the rates at which the transmit data words 46 and receive data words 56 will be transceived with the programmable logic fabric 12. Note that the transmit data words 46 may be received from the programmable logic fabric 12 at a different rate than the receive data words 56 are provided to the programmable logic fabric 12.

As one of average skill in the art will appreciate, each of the modules within the programmable PMA 32 and the programmable PCS 34 may be individually programmed to support a desired data transfer rate. The data transfer rate may be in accordance with a particular standard such that the receive path, i.e., the path through programmable receive PMA module 40 and the programmable receive PCS module 44, may be programmed in accordance with one standard, while the transmit path, i.e., the path through the programmable transmit PCS module 42 and the programmable transmit PMA module 38, may be programmed in accordance with the same or another standard.

Figure 3:
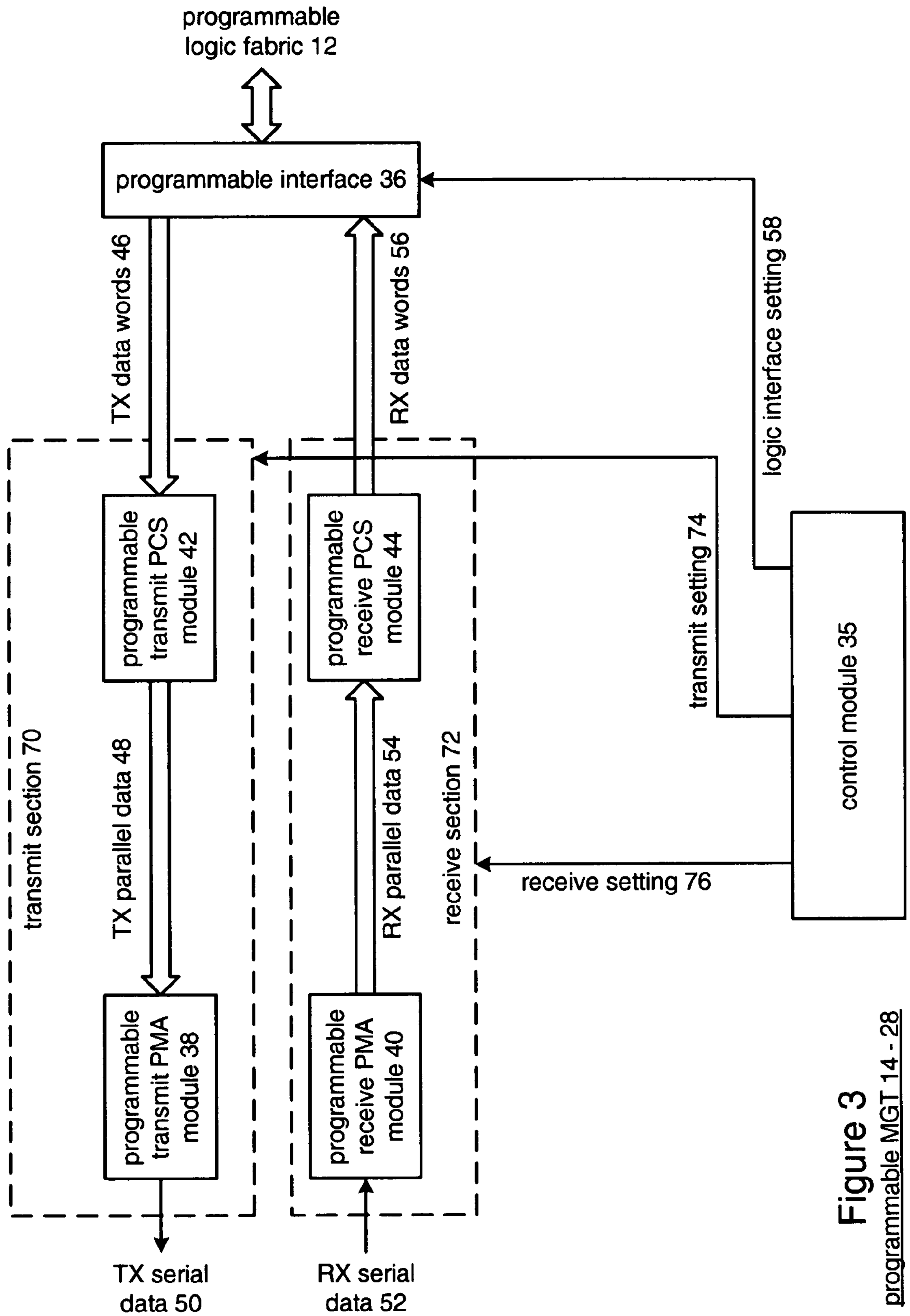
FIG. 3 illustrates an alternate schematic block diagram of a representative one of the programmable multi-gigabit transceivers.

FIG. 3 illustrates an alternate schematic block diagram of a representative one of the PMGTs 14–28. In this embodiment, the PMGTs 14–28 include a transmit section 70, a receive section 72, the control module 35 and the programmable interface 36. The transmit section 70 includes the programmable transmit PMA module 38 and the programmable transmit PCS module 42. The receive section 72 includes the programmable receive PMA module 40 and the programmable receive PCS module 44.

In this embodiment, the control module 35 separately programs the transmit section and the receive section via transmit setting 74 and receive setting 76, respectively. The control module 35 also programs the programmable interface 36 via the logic interface setting 58. Accordingly, the control module 35 may program the receive section 72 to function in accordance with one standard while programming the transmit section 70 in accordance with the same or another standard. Further, the logic interface setting 58 may indicate that the transmit data words 46 are received from the programmable logic fabric 12 at a different rate than the receive data words 56 are provided to the programmable logic fabric 12. As one of average skill in the art will appreciate, the programmable interface 36 may include a transmit buffer and a receive buffer, and/or an elastic store buffer to facilitate the providing and receiving of transmit data words 46 and receive data words 56 to and from the programmable logic fabric 12.

Figure 4A:
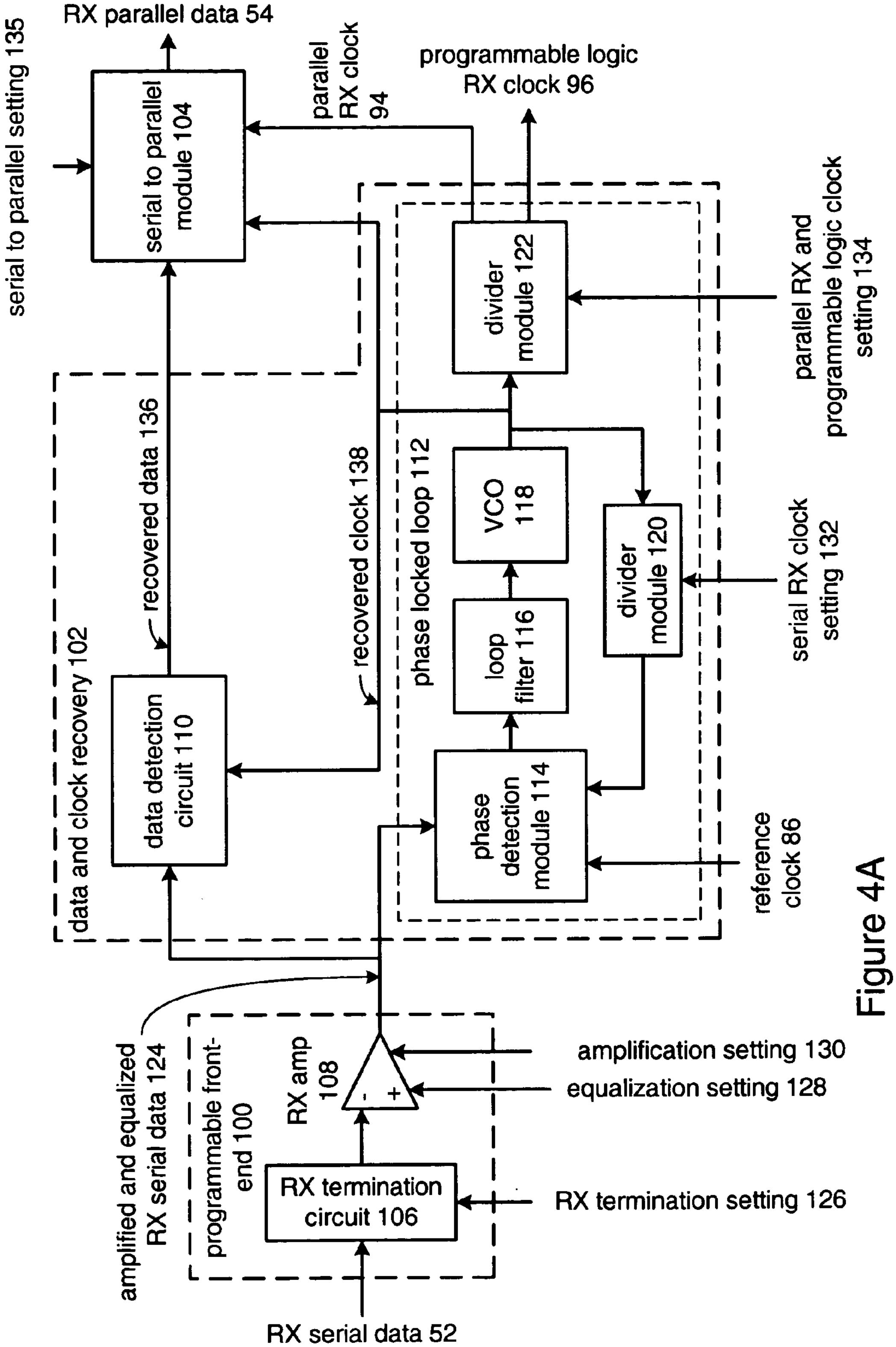
FIG. 4A illustrates a schematic block diagram of a programmable receive PMA module that includes a programmable front-end, a clock and data recovery module, and a serial-to-parallel module.
Figure 4B:
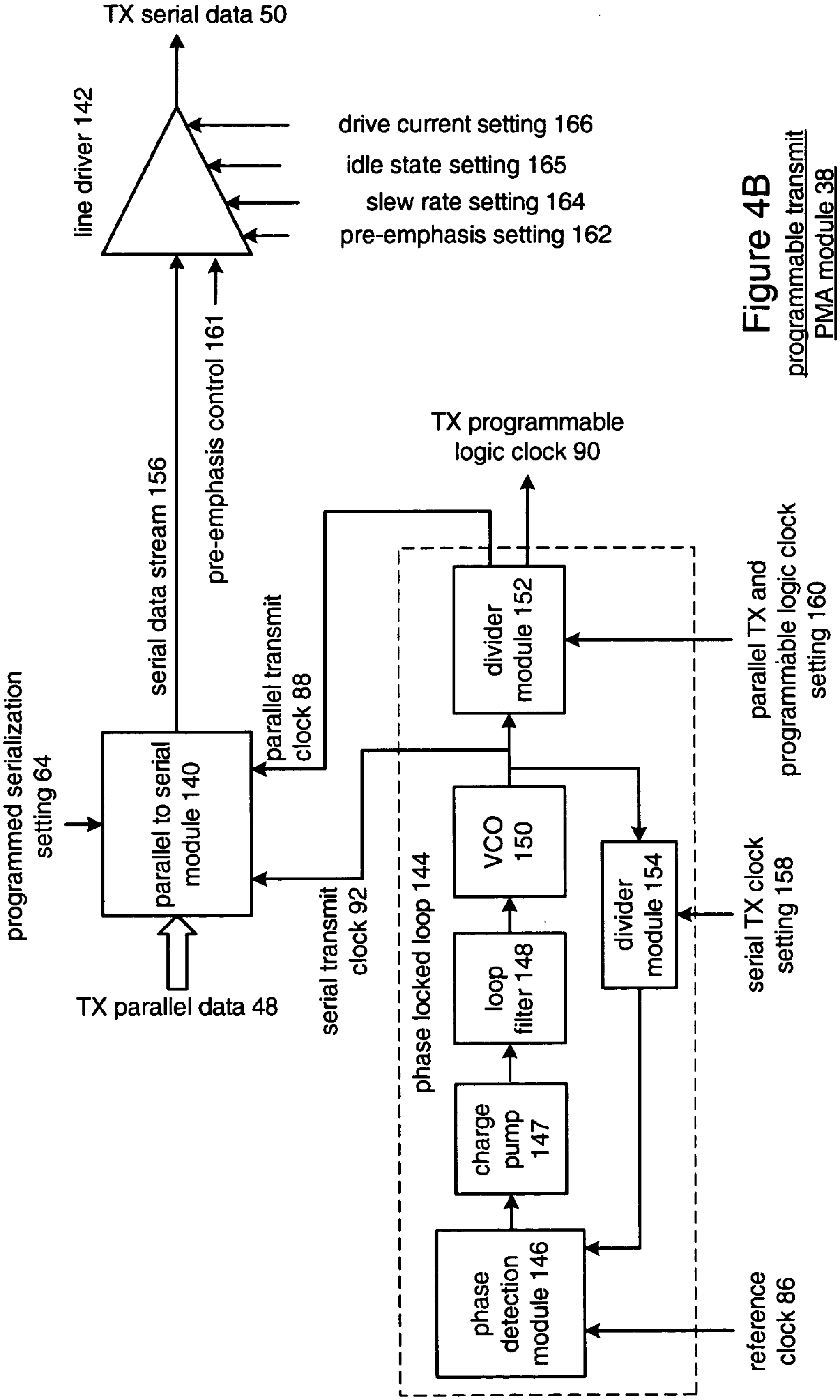
FIG. 4B illustrates a schematic block diagram of a programmable transmit PMA module that includes a phase-locked loop, a parallel-to-serial module, and line driver.

FIG. 4A illustrates a schematic block diagram of the programmable receive PMA module 40 that includes a programmable front-end 100, a clock and data recovery module 102, and a serial-to-parallel module 104. The programmable front-end 100 includes a receive termination circuit 106 and a receive amplifier 108. The clock and data recovery (CDR) module 102 includes a data detection circuit 110 and a phase-locked loop 112. The phase-locked loop 112 includes a phase detection module 114, a loop filter 116, a voltage controlled oscillator (VCO) 118, a first divider module 120, and a second divider module 122.

The programmable front-end 100 is operably coupled to receive the receive serial data 52 and produce amplified and equalized receive serial data 124 therefrom. To achieve this, the receiver termination circuit 106 is programmed in accordance with a receive termination setting 126 to provide the appropriate termination for the transmission line between the programmable receive PMA module 40 and the source that originally transmitted the receive serial data 52. The receive termination setting 126 may indicate whether the receive serial data 52 is a single-ended signal, a differential signal, may indicate the impedance of the transmission line, and may indicate the biasing of the receiver termination circuit 106. For a more detailed discussion of the receive termination circuit 106, refer to co-pending patent application entitled "RECEIVER TERMINATION NETWORK AND APPLICATION THEREOF", by Charles W. Boecker, et al., and having the same filing date as the present application. This co-pending application is incorporated by reference, herein.

The receive termination circuit 106 further biases the receive serial data 52 and provides the bias adjusted signal to the receive amplifier 108. The equalization and gain settings of the receive amplifier 108 may be adjusted in accordance with equalization setting 128 and amplification setting 130, respectively. The receive amplifier 108 is further described in co-pending patent application entitled "ANALOG FRONT-END HAVING BUILT-IN EQUALIZATION AND APPLICATIONS THEREOF", by William C. Black, et al., and having a filing date the same as the present patent application. This co-pending application is incorporated by reference, herein. Note that the receive termination setting 126, the equalization setting 128, and the amplification setting 130 are part of the programmed deserialization setting 66 provided by the control module 35.

The clock and data recovery module 102 receives the amplified and equalized receive serial data 124 via the phase detection module 114 of phase-locked loop 112 and via the data detection circuit 110. The phase detection module 114 has been initialized prior to receiving the amplified and equalized receive serial data 124 by comparing the phase and/or frequency of a reference clock 86 with a feedback reference clock produced by divider module 120. Based on this phase and/or frequency difference, the phase detection module 114 produces a corresponding current signal that is provided to loop filter 116. The loop filter 116 converts the current into a control voltage that adjusts the output frequency of the VCO 118. The divider module 120, based on a serial receive clock setting 132, divides the output oscillation produced by the VCO 118 to produce the feedback reference clock. Once the amplified and equalized receive serial data 124 is received, the phase detection module 114 compares the phase of the amplified and equalized receive serial data 124 with the phase of the feedback reference clock, and produces a current signal based on the phase difference.

The phase detection module 114 provides the current signal to the loop filter 116, which converts it into a control voltage that controls the output frequency of the VCO 118. At this point, the output of the VCO 118 corresponds to a recovered clock 138 in steady state operation. The recovered clock 138 is provided to the divider module 122, the data detection circuit 110 and to the serial-to-parallel module 104. The data detection circuit 110 utilizes the recovered clock 138 to produce recovered data 136 from the amplified and equalized receive serial data 124. The divider module 122 divides the recovered clock 138, in accordance with a parallel receive and programmable logic clock setting 134, to produce a parallel receive clock 94 and a programmable logic receive clock 96. Note that the serial receive clock setting 132 and the parallel receive and programmable logic clock setting 134 are part of the programmed deserialization setting 66 provided to the programmable receive PMA module 40 by the control module 35.

The serial-to-parallel module 104, which may include an elastic store buffer, receives the recovered data 136 at a serial rate in accordance with the recovered clock 138. Based on a serial-to-parallel setting 135 and the parallel receive clock 194, the serial-to-parallel module 104 outputs the receive parallel data 54. The serial-to-parallel setting 135, which may be part of the programmed deserialization setting 66, indicates the data rate and data width of the receive parallel data 54.

FIG. 4B illustrates a schematic block diagram of a programmable transmit PMA module 38 that includes a phase-locked loop 144, a parallel-to-serial module 140, and a line driver 142. The phase-locked loop 144 includes a phase detection module 146, a loop filter 148, a voltage controlled oscillator 150, a divider module 154, and a divider module 152.

The phase detection module 146 compares the phase and/or frequency of the reference clock 86 with the phase and/or frequency of an output (feedback reference clock) produced by divider module 154. The phase detection module 146 generates control signals to loop filter 148 which, in turn, produces a current signal to represent the phase and/or frequency difference between the reference clock 86 and the feedback oscillation to loop filter 148. The loop filter 148 converts the current signal into a control voltage that regulates the output oscillation produced by the VCO 150. Divider module 154, based on a serial transmit clock setting 158, divides the output oscillation of the VCO 150, which corresponds to a serial transmit clock 92, to produce the oscillation. Note that the serial transmit clock setting 158 may be part of the programmed serialization setting 64 provided to the programmable transmit PMA module 38 by the control module 35.

Divider module 152 receives the serial transmit clock 92 and, based on a parallel transmit and programmable logic clock setting 160, produces a parallel transmit clock 88 and the transmit programmable logic clock 90. The parallel transmit and programmable logic clock setting 160 may be part of the programmed serialization setting 64.

The parallel-to-serial module 140 receives the transmit parallel data 48 and produces therefrom a serial data stream 156. To facilitate the parallel-to-serial conversion, the parallel-to-serial module 140, which may include an elastic store buffer, receives a parallel-to-serial setting to indicate the width of the transmit parallel data 48 and the rate of the transmit parallel data, which corresponds to the parallel transmit clock 88. Based on the parallel-to-serial setting, the serial transmit clock 92 and the parallel transmit clock 88, the parallel-to-serial module 140 produces the serial data stream 156 from the transmit parallel data 48.

The line driver 142 increases the power of the signals forming serial data stream 156 to produce the transmit serial data 50. The line driver 142 may be programmed to adjust its pre-emphasis settings, slew rate settings, and drive settings via a pre-emphasis control signal 161, a pre-emphasis setting 162, a slew rate setting 164, an idle state setting 165 and a drive current setting 166. The pre-emphasis control signal 161, the pre-emphasis setting 162, the slew rate setting 164, the idle state setting 165 and the drive current setting 166 may be part of the programmed serialization setting 64. As one of average skill in the art will appreciate, while the diagram of FIG. 4B is shown as a single-ended system, the entire system may use differential signaling and/or a combination of differential and single-ended signaling. Further details on the line driver 142 are described in co-pending patent application entitled DAC BASED DRIVER WITH SELECTABLE PRE-EMPHASIS SIGNAL LEVELS, by Eric D. Groen et al., and having a filing date the same as the present patent application and in co-pending patent application entitled TX LINE DRIVER WITH COMMON MODE IDLE STATE AND SELECTABLE SLEW RATES, by Eric D. Groen et al. and having a filing date the same as the present patent application. These co-pending applications are incorporated by reference, herein.

Figure 5:
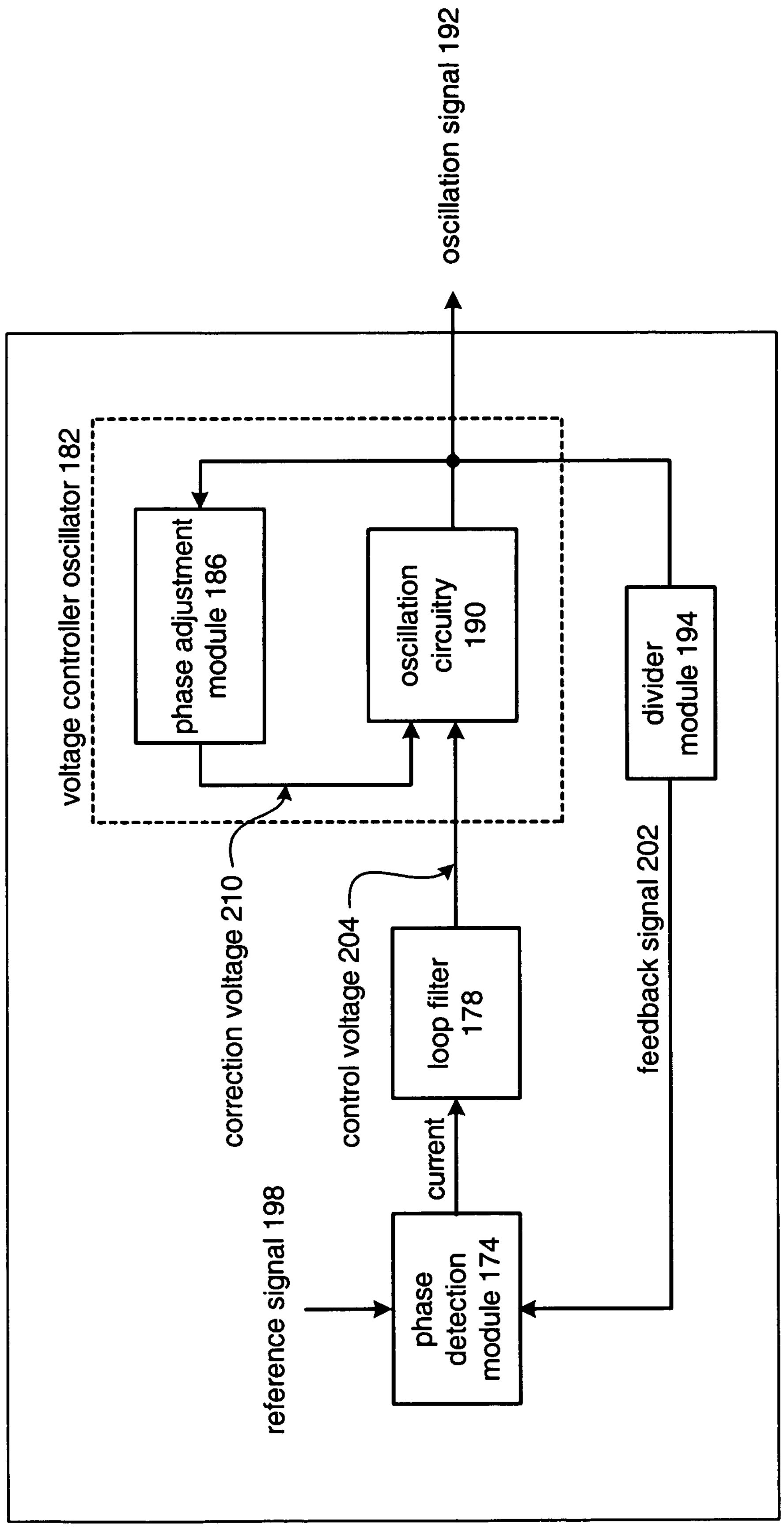
FIG. 5 is a functional block diagram of a phase-locked loop that substantially reduces phase noise according to one embodiment of the invention.

FIG. 5 is a functional block diagram of a phase-locked loop according to one embodiment of the present invention. Phase-locked loop 170 comprises a phase detection module 174, a loop filter 178, a voltage controlled oscillator (VCO) 182, and a divider module 194. The VCO further comprises a phase adjustment module 186 and oscillation circuitry 190. Phase detection module 174 receives a reference signal 198 (typically produced by a reference clock) and a feedback signal 202 and produces an error current proportional to the phase difference between reference signal 198 and feedback signal 202. The current is produced by phase detection module 174 to loop filter 178 which converts the error current into a control voltage 204 proportional to the received error current. Control voltage 204 is coupled to a first input of oscillation circuitry 190 to adjust a frequency of an oscillation signal 192 produced by oscillation circuitry 190. Oscillation signal 192 is coupled to divider module 194 to produce feedback signal 202 based on a divider number used to reduce the oscillation signal frequency substantially equal to reference signal 198. Oscillation signal 192 produced by oscillation circuitry 190 is also coupled in a feedback loop to phase adjustment module 186. Phase adjustment module 186 samples oscillation signal 192 over a number of periods to produce a correction voltage 210 to a second input of oscillation circuitry 190. Correction voltage 210 is signed and scaled to correct changes in the frequency of oscillation signal 192 due to presence of phase noise. The operation of phase adjustment module 186 will be discussed with respect to the following figures.

Figure 6:
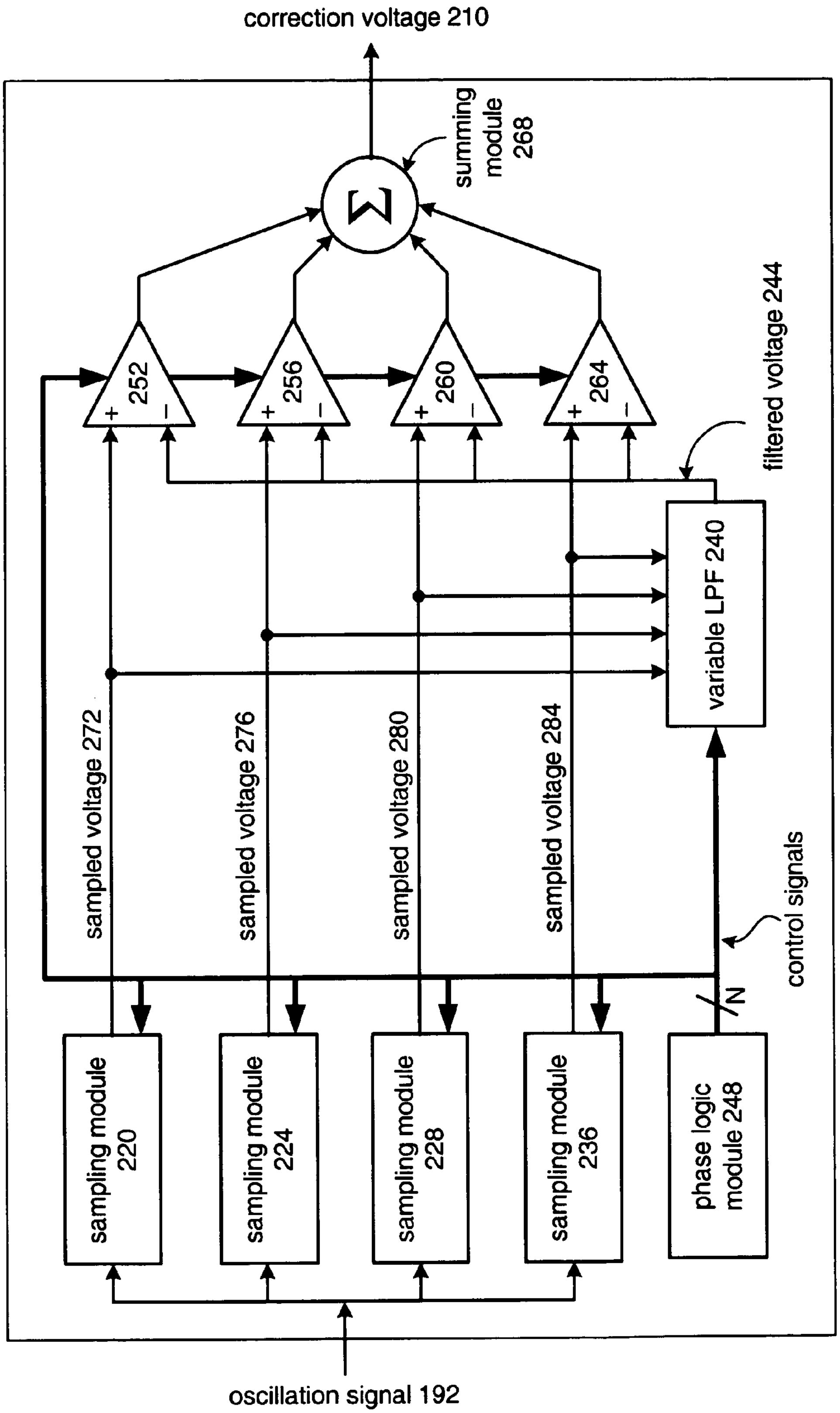
FIG. 6 is a functional block diagram of a phase adjustment module according to one embodiment of the invention.

FIG. 6 is a functional block diagram of a phase adjustment module according to one embodiment of the present invention. Phase adjustment module 186 includes a plurality of sampling modules 220–236, a phase logic module 248, a variable low pass filter (LPF) 240, a plurality of operational amplifiers 252–264, and a summing module 268. The sampling modules of phase adjustment module 186, namely, sampling modules 220, 224, 228 and 236, are coupled to receive oscillation signal 192 from VCO 182 (of FIG. 5), each producing therefrom a sampled voltage, namely, sampled voltages 272, 276, 280, and 284, representing the period of oscillation signal 192 sampled over different time intervals. The sampled voltages 272–284 are coupled to variable LPF 240 which produces a filtered voltage 244 that is essentially a running average of the received sampled voltages. Variable LPF 240 receives at least one control signal from phase logic module 248 to change the filtering of variable LPF 240 which effectively changes the length of the running average. Sampled voltages 272–284 produced from the sampling modules 220–236 are each coupled to a first input of a corresponding operational amplifier of the plurality of operational amplifiers, namely, operational amplifiers 252, 256, 260 and 264. The operational amplifiers 252–264 are further coupled to receive filtered voltage 244 at a second input.

Each operational amplifier 252–264 produces an output signal representing a difference between the sampled voltage and filtered voltage 244 to summing module 268 that sums the output signals to produce correction voltage 210. Each operational amplifier can be configured as one of a transconductance amplifier or a voltage amplifier, depending on a desired configuration. As is known to one of average skill in the art, a transconductance amplifier receives a voltage input and produces a current output. Each operational amplifier is further coupled to receive at least one control signal from phase logic module 248, wherein the at least one control signal may be used to change the gain of the operational amplifiers and to reduce any offset voltages present in the operational amplifier. Summing module 268 may be formed in any configuration known to one of average skill in the art to sum the operational amplifier output signals and produce therefrom correction voltage 210.

Any phase noise present in oscillation signal 192 received by phase adjustment module 186 will change the frequency of oscillation signal 192 coupled to the sampling modules 220–236 of phase adjustment module 186. Each sampling module 220–236 is formed to sample oscillation signal 192 over a different time interval, thus the sampled voltages, namely, sampled voltages 272, 276, 280 and 284, will have a sampled voltage level that reflects the frequency change and therefore a period change during the sampled interval. The operation of the sampling modules will be discussed with respect to the following figures.

Figure 7:
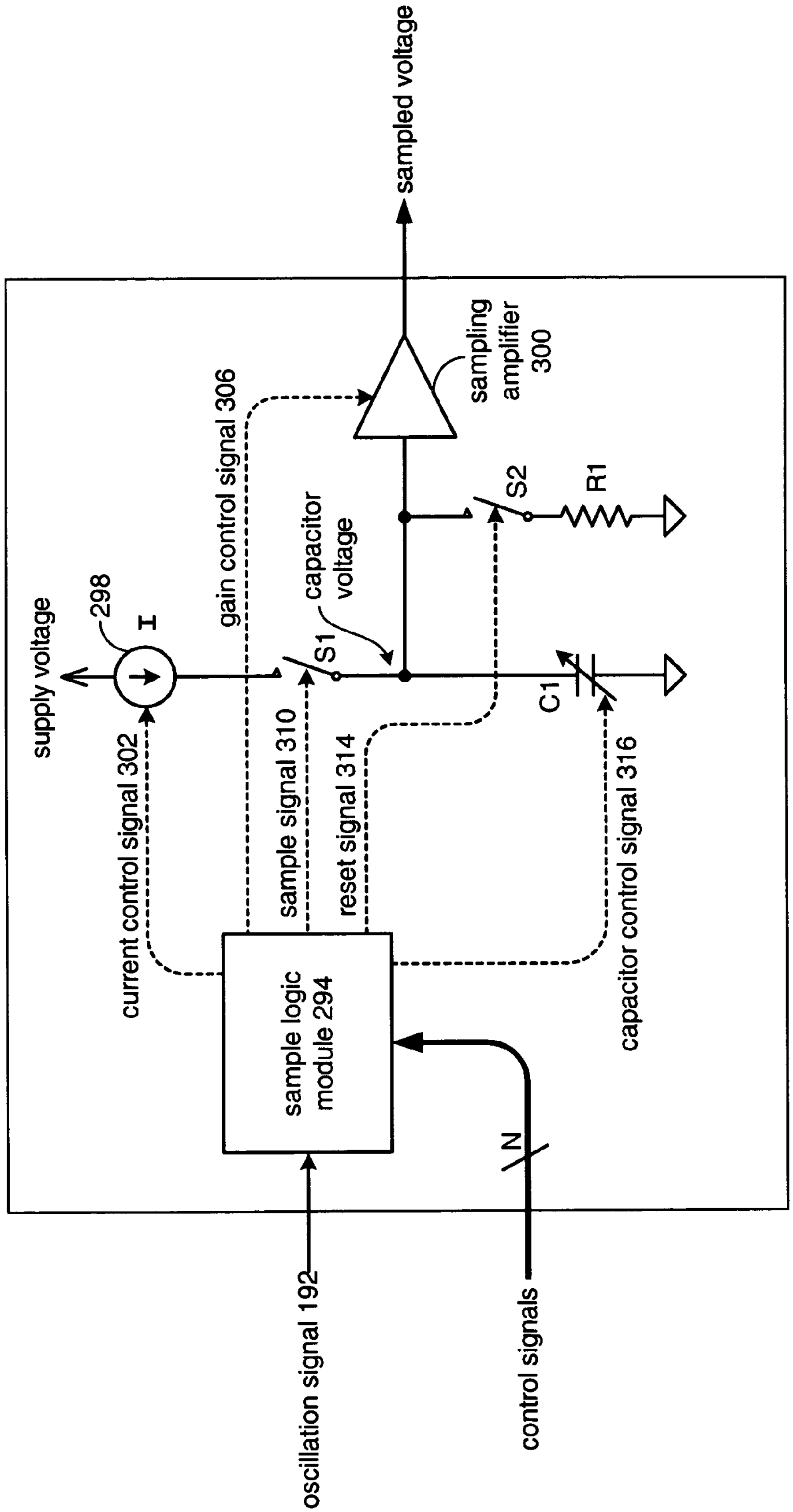
FIG. 7 is a functional schematic diagram of a sampling module according to one embodiment of the present invention.

FIG. 7 is a functional schematic diagram of a sampling module according to one embodiment of the present invention. Sampling module 290 includes a sampling logic module 294, a variable current source 298, a sampling amplifier 300, a plurality of switches S1 and S2, a variable capacitor C1 and a resistor R1. Sampling logic module 294 is operatively coupled to receive oscillation signal 192 and at least one control signal from phase logic module 248 of FIG. 6, and to produce therefrom a plurality of control signals, namely, a current control signal 302, a gain control signal 306, a sample signal 310, a reset signal 314, and a capacitor control signal 316. Variable current source 298 is serially coupled to switch S1 which is further serially coupled to variable capacitor C1, which is further coupled to circuit common. Switch S1 couples variable current source 298 to variable capacitor C1 based on sample signal 310 from sampling logic module 294. Sample signal 310 functions to open and close switch S1, thereby selectively charging variable capacitor C1 with a current I produced from variable current source 298.

Sampling logic module 294 generates sample signal 310 responsive to the at least one control signal received from phase logic module 248, wherein sample signal 310 corresponds to a specified time interval. When switch S1 is closed, variable capacitor C1 charges with current I produced from variable current source 298 during the specified time interval, producing a capacitor voltage to sampling amplifier 300. The capacitor voltage coupled to sampling amplifier 300 represents the period of oscillation signal 192 sampled during the specified time interval. Sampling amplifier 300, having one of a fixed or variable gain as determined by gain control signal 306, produces the sampled voltage, namely, one of sampled voltages 272, 276, 280 or 284 of FIG. 6. Responsive to reset signal 314 from sampling logic module 294, switch S2 will close to discharge the capacitor voltage of variable capacitor C1 through resistor R1. Resistor R1 has a very small resistive value to safely discharge the capacitor voltage of variable capacitor C1 to circuit common. Resistor R1 may be a small ON resistance of a MOSFET switch, such as switch S2, or may be a separate resistive element.

Variable current source 298 and variable capacitor C1 values are chosen as necessary to allow variable capacitor C1 to charge to one-half of the supply voltage during the specified time interval which represents, typically, one cycle of oscillation signal 192. If variable current source 298 and variable capacitor C1 are chosen too large, the capacitor voltage developed during the specified time interval will not be large enough to have a desired resolution. Alternately, if variable current source 298 and variable capacitor C1 are chosen too small, variable capacitor C1 will charge to approximately the supply voltage during the specified time interval and will not, therefore, provide information regarding changes in the oscillation signal frequency. Variable capacitor C1 is formed as a selectable capacitor bank as is know to one of average skill in the art. Variable current source 298 may be formed as one of a selectable resistive array or a current mirror configuration.

Figure 8:
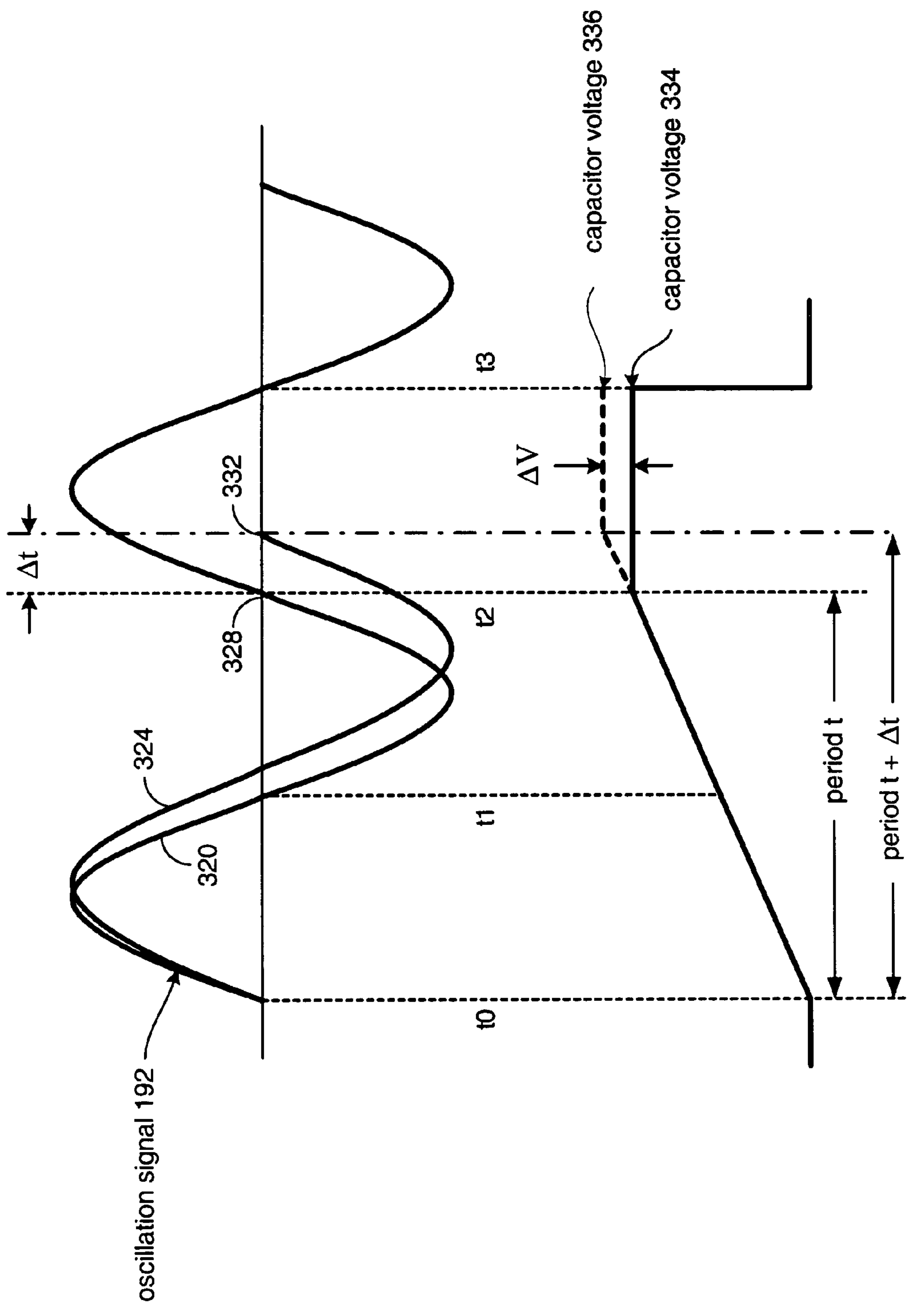
FIG. 8 illustrates sampling of an oscillation signal using a method according to one embodiment of the invention.

FIG. 8 illustrates oscillation signal sampling according to one embodiment of the present invention. Oscillation signal 192 is sampled according to a zero crossing technique, wherein variable capacitor C1 of FIG. 7 will charge during one full cycle of oscillation signal 192. Additionally, oscillation signal 192 is shown as waveform 320 without phase noise and as waveform 324 with phase noise, contributing to an increase in period (decrease in frequency). As is known to one of average skill in the art, phase noise is the change in phase or, conversely, frequency of an oscillation signal over time. As can be seen in FIG. 8, the variable capacitor C1 of FIG. 7 will charge from time t0 until the next zero crossing t2, thus representing a period t of oscillation signal 192. A capacitor voltage 334 level at time t2 represents a sample of the period of oscillation signal 192 over the specified time interval of t0 to t2.

When oscillation signal 192 experiences phase noise as illustrated by waveform 324, the period of waveform 324 changes causing a change in the zero crossing from zero crossing 328 to zero crossing 332. The change in period, or Δt, allows the capacitor voltage to charge for a longer period of time, period t plus Δt, thus generating a larger capacitor voltage, namely, capacitor voltage 336. The change in capacitor voltage, ΔV, represents a voltage error introduced by the phase noise. The voltage error is produced to summing module 286 (of FIG. 6) by subtracting the filtered voltage (average voltage) from the sampled voltage.

The voltage error when summed with the other voltage errors, functions to correct the change in frequency of oscillation signal 192 caused by the phase noise. For example, as illustrated in FIG. 8, a frequency of oscillation signal 192 has gone down, thus the period of the oscillation signal has increased from t2 to t2+Δt. The increase in period causes a corresponding increase in the sampled voltage as indicated by ΔV. The increased sampled voltage causes a corresponding increase in the correction voltage coupled back to the second input of oscillation circuitry 190 (of FIG. 5), thereby increasing the oscillation signal frequency of the VCO. The increased oscillation signal frequency, when combined with the frequency shift produced by the phase noise, results in a signal having a frequency of oscillation that is approximately equal to the intended oscillation represented as waveform 320 in FIG. 8.

Figure 9:
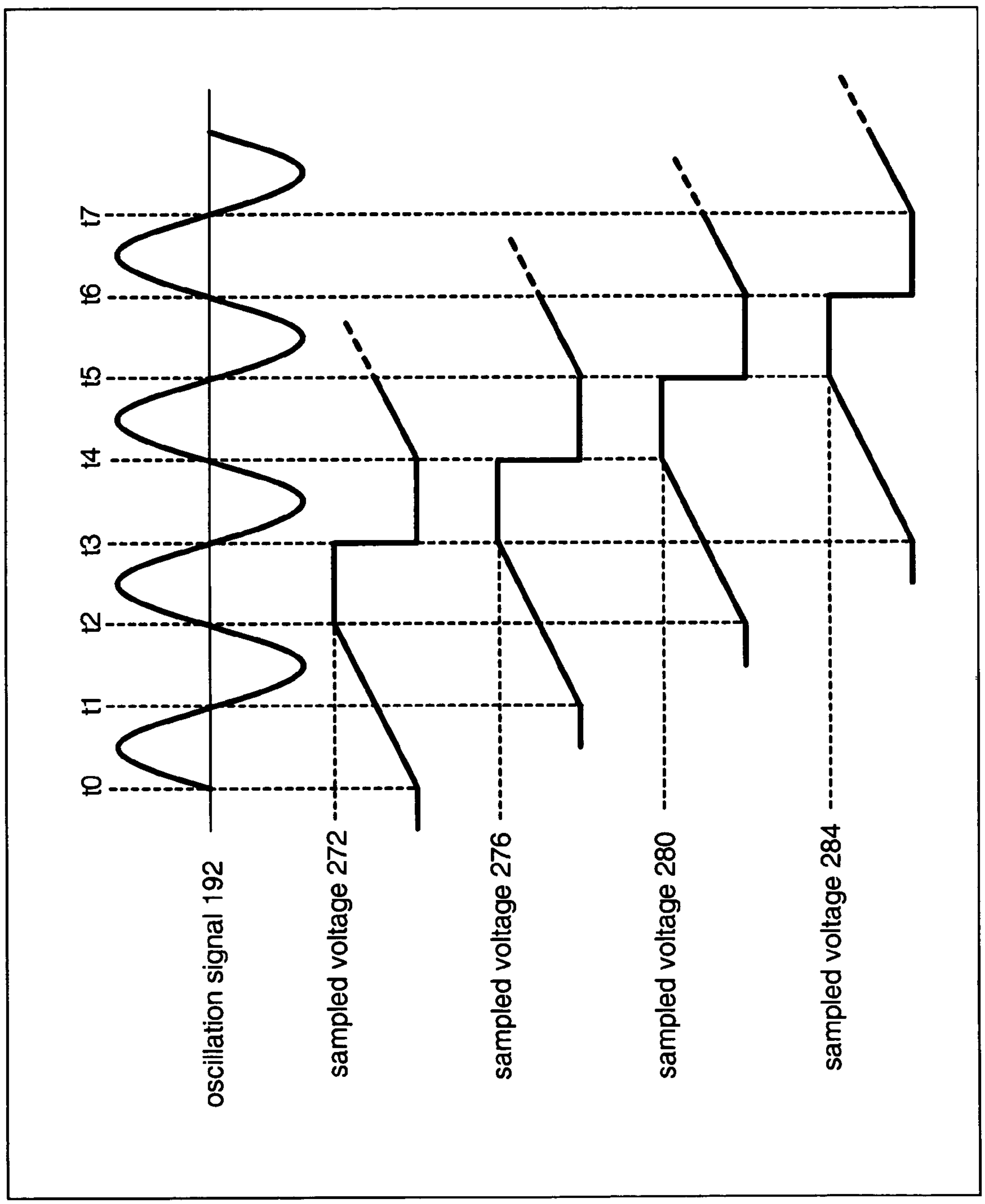
FIG. 9 is illustrates a zero crossing sampling scheme in accordance with one embodiment of the present invention.

FIG. 9 illustrates a zero crossing sampling scheme in accordance with one embodiment of the present invention. Oscillation signal 192 is sampled at specified intervals by the operation of the sampling modules as was described with respect to FIG. 6. Sampling module 220 of FIG. 6 is configured to sample oscillation signal 192 from a positive going zero crossing, time t0, for one full cycle ending at time t2, thereby producing sampled voltage 272. After a hold period from t2 to t3 and a reset period from t3 to t4, the sampling module starts another sample at t4. Similarly, sampling module 228 of FIG. 6 starts sampling at positive going zero crossing t2 to produce sampled voltage 280.

Sampling module 224 of FIG. 6 is configured to sample oscillation signal 192 from a negative going zero crossing, time t1, for one full cycle ending at time t3, thereby producing sampled voltage 276. After a hold period from t3 to t4 and a reset period from t4 to t5, the sampling module starts another sample at t5. Similarly, sampling module 236 of FIG. 6 starts sampling at negative going zero crossing t3 to produce sampled voltage 284.

By sampling for one full cycle at different points on oscillation signal 192, changes in the sampled voltages represent small deviations in the oscillation frequency and, therefore, phase error or phase noise. The difference between the sampled voltage and the average of all the sampled voltages represent an amount of correction necessary to substantially correct the phase noise.

Figure 10:
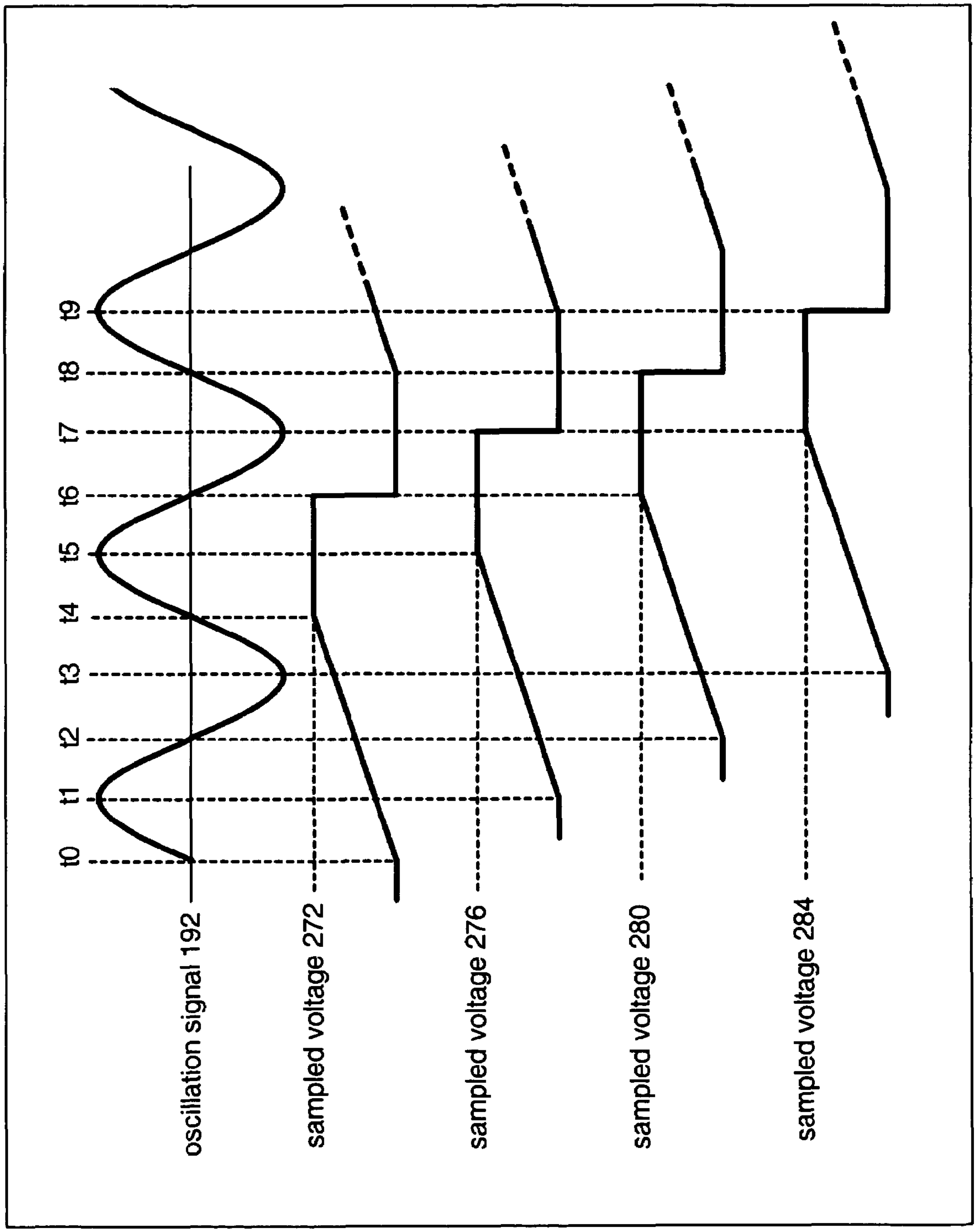
FIG. 10 illustrates a one-quarter cycle sampling scheme in accordance with one embodiment of the present invention.

FIG. 10 illustrates a one-quarter cycle sampling scheme in accordance with an alternate embodiment of the present invention. In this embodiment, each sampling module of FIG. 6 samples oscillation signal 192 for one full cycle every 90 degrees, or one-quarter of a full cycle. For example, sampled voltage 272 begins at t0, sampled voltage 276 begins at t1, sampled voltage 280 begins at t2, and sampled voltage 284 begins at t3. Each sampled voltage is held for one-half cycle and reset for one-half cycle before starting another cycle. For example, sampled voltage 272 completes sampling at t4 and holds it until t6 when it is reset from t6 to t8. The sampling cycle starts over at t8.

Figure 11:
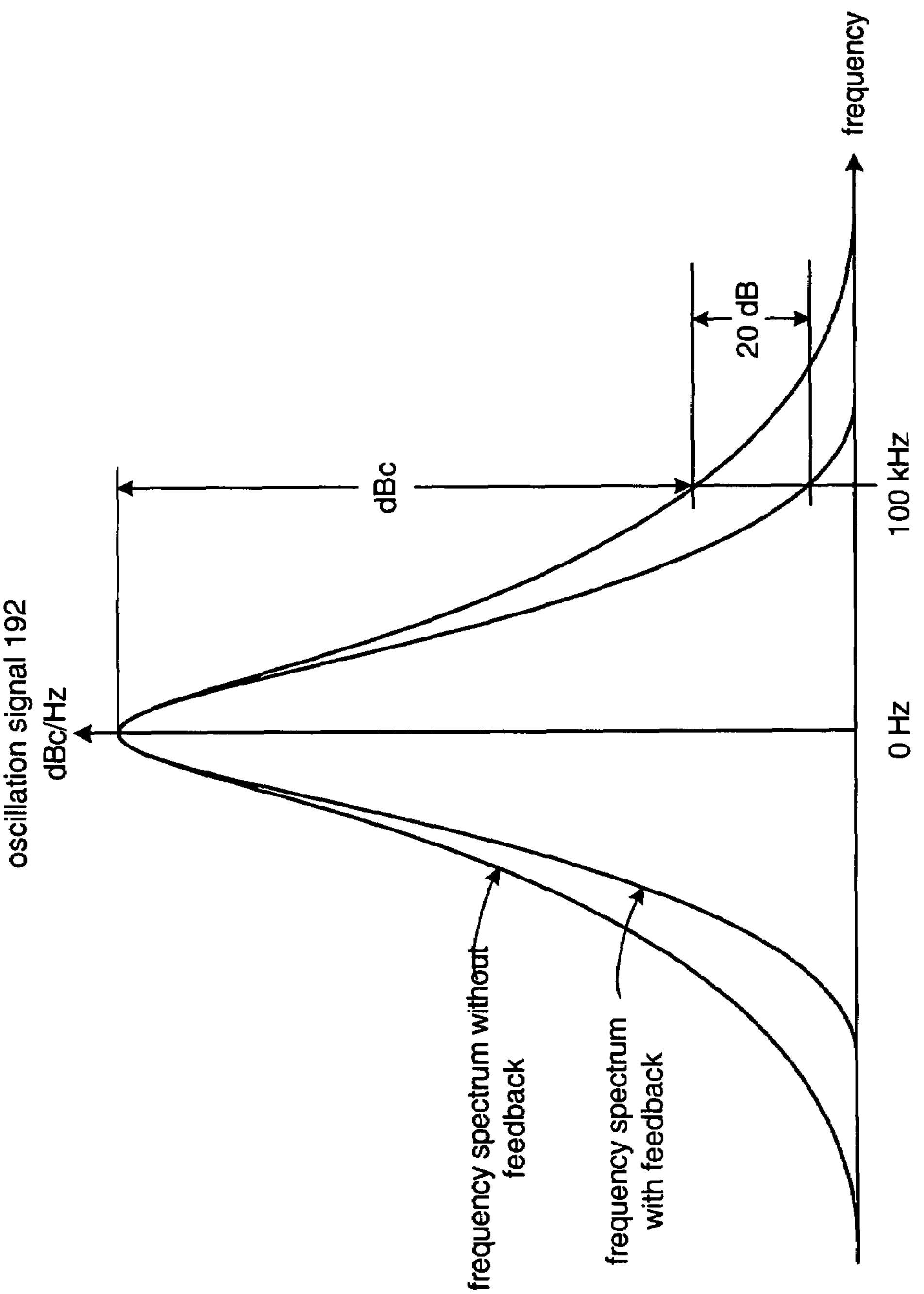
FIG. 11 illustrates a frequency domain phase noise plot of an oscillation signal.

FIG. 11 illustrates a frequency domain phase noise plot of an oscillation signal. The frequency domain phase noise plot of oscillation signal 192 is characterized as a plot of spectral density per unit of bandwidth. Phase noise is characterized as a power level relative to the oscillation signal power at a frequency offset from the oscillation signal frequency. For example, at a 100 kHz offset from the center frequency of oscillation signal 192, the power level is measured as a power level referenced to the power level at the center frequency, or dBc. The reduction of phase noise is characterized as a reduction in power levels at the 100 kHz offset. For example, at 100 kHz the phase noise reduction results in a hypothetical 20 dB reduction in measured power level. FIG. 11 further illustrates a reduction in the frequency spectrum due to the correction voltage feedback reducing the phase noise in the oscillation signal.

Figure 12:
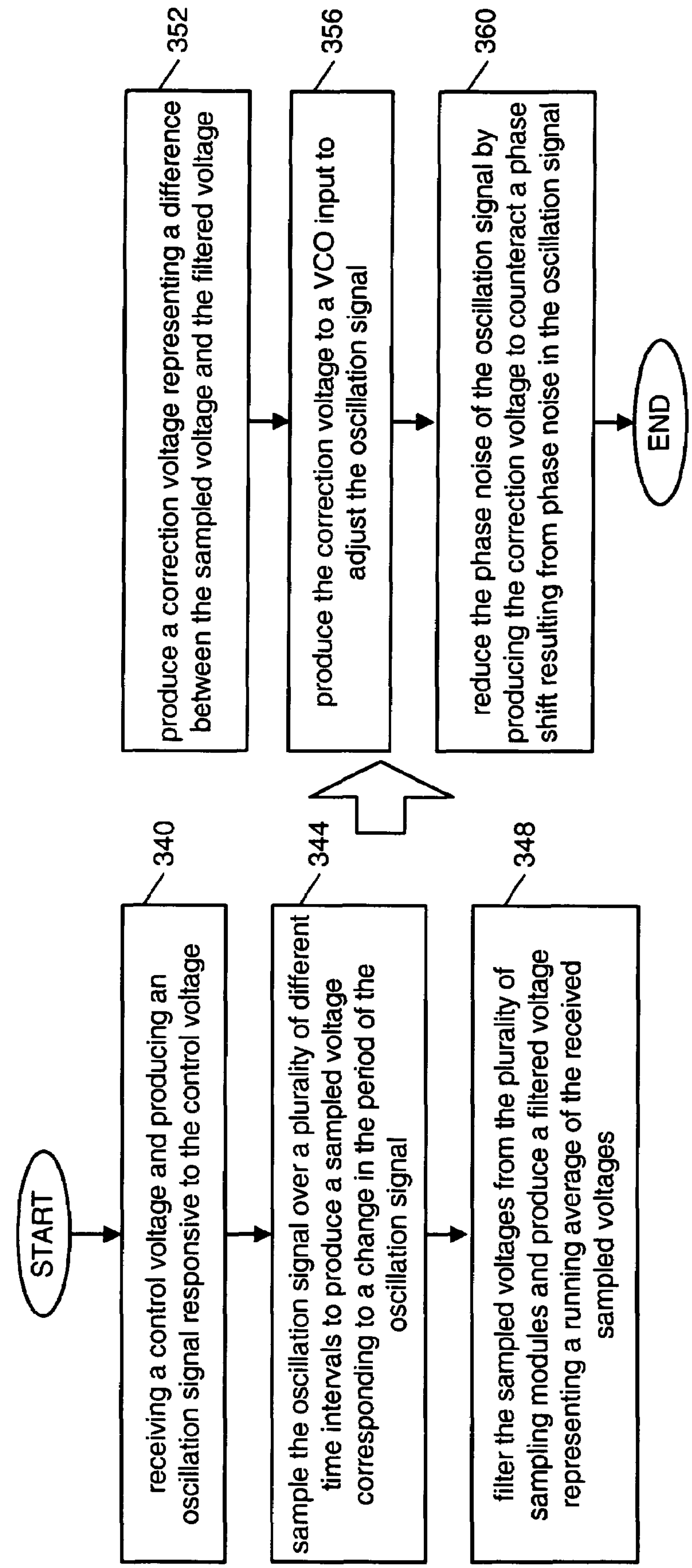
FIG. 12 illustrates a sampling method to reduce phase noise according to one embodiment of the present invention.

FIG. 12 illustrates a sampling method to reduce phase noise according to one embodiment of the present invention. A VCO containing the circuit of the embodiment receives a control voltage and produces an oscillation signal responsive to the control voltage (step 340). Phase noise manifests itself as a small change in time and thus frequency of the oscillation signal. One aspect of the present invention is to correct for the small change in oscillation frequency by introducing a corresponding change in the control voltage to offset this change in frequency caused by the phase noise. The circuitry samples the oscillation signal over a plurality of different time intervals to produce a sampled voltage corresponding to a change in the period of the oscillation signal (step 344). The plurality of different time intervals is specified so that each sampled voltage may capture small changes in the period of the oscillation signal.

The sampled voltages produced from the plurality of sampling modules are filtered to produce a filtered voltage representing a running average of the received sampled voltages (step 348). The filtering function may be changed to change the length of the running average to change the dynamic response of the circuit. For example, a longer running average will attempt to dampen out short term changes in the oscillation frequency. An embodiment of the invention includes producing a correction voltage representing a difference between the sampled voltages and the filtered voltage (step 352). This difference, therefore, represents a difference between the sampled voltage and the running average of all the sampled voltages over a specified time interval. The embodiment further includes producing the correction voltage to a VCO input to adjust the oscillation signal (step 356). The correction voltage is signed and scaled so as to correct the VCO oscillation signal in a direction that substantially cancels the phase noise. Thus, the embodiment reduces the phase noise of the oscillation signal by producing the correction voltage to counteract a phase shift resulting from phase noise in the oscillation signal (step 360).

The invention disclosed herein is adaptable to various modifications and alternative forms. Therefore, specific embodiments have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A phase-locked loop (PLL) for producing a phase-locked oscillation, the PLL comprising:

a phase detection module for producing a current representing a phase difference between a feedback signal and a reference signal;

a loop filter operably coupled to receive the current and for converting the current into a control voltage; and a voltage controlled oscillator (VCO) operably coupled to receive the control voltage at a VCO input and to produce an oscillation signal responsive to the control voltage wherein the oscillation signal is provided to the phase detection module in a first feedback loop, wherein:

the VCO further comprises a phase adjustment module for reducing phase noise in the oscillation signal, the phase adjustment module operably coupled to receive the oscillation signal and to produce a correction voltage to counteract a phase shift resulting from phase noise in the oscillation signal; and wherein the correction voltage is provided to adjust the oscillation signal frequency in a second feedback loop; and wherein the phase adjustment module further includes a plurality of sampling modules coupled to receive the oscillation signal, wherein each sampling module of the plurality of sampling modules samples the oscillation signal over a different time interval to produce a sampled voltage corresponding to a change in the period of the oscillation signal.

2. The PLL of claim 1 further including a variable low pass filter coupled to receive the sampled voltage from the plurality of sampling modules, wherein the variable low pass filter produces a filtered voltage representing a running average of the received sampled voltage.

3. The PLL of claim 2 further including a plurality of operational amplifiers, each operational amplifier coupled to receive, at a first input, the sampled voltage produced from each sampling module of the plurality of sampling modules, and coupled to receive the filtered voltage at a second input, and wherein each operational amplifier produces an output signal representing a difference between the received sampled voltage and the received filtered voltage.

4. The PLL of claim 3 wherein each operational amplifier is configured as a transconductance amplifier wherein the output signal is a current signal.

5. The PLL of claim 3 wherein each operational amplifier is configured as a voltage amplifier wherein the output signal is a voltage signal.

6. The PLL of claim 3 further including a summing module operably coupled to receive the output signals from each operational amplifier of the plurality of operational amplifiers and to produce therefrom the correction voltage.

7. The PLL of claim 6 further including a phase logic module for controlling operational characteristics of the phase adjustment module.

8. The PLL of claim 7 wherein the sampling module of the plurality of sampling modules further includes a sampling logic module operably coupled to receive the oscillation signal and operably coupled to receive at least one control signal from the phase logic module.

9. The PLL of claim 8 further including a variable current source serially coupled to a switch which is serially coupled to a capacitor, the variable current source for charging the capacitor during a specified time interval.

10. The PLL of claim 9 further including a sampling amplifier coupled to receive a capacitor voltage and to produce a sampled voltage corresponding to the period of the oscillation signal during the specified time interval.

11. The PLL of claim 10 wherein the sampling amplifier includes one of a fixed gain and a variable gain.

12. The PLL of claim 10 wherein the capacitor comprises a variable capacitor.

13. A VCO, comprising:

oscillation circuitry operably coupled to receive a control voltage at a VCO input and to produce an oscillation signal responsive to the control voltage;

a phase adjustment module for reducing phase noise in the oscillation signal, the phase adjustment module operably coupled to receive the oscillation signal and to produce a correction voltage to counteract a phase shift resulting from phase noise in the oscillation signal; and wherein the correction voltage is provided to adjust the oscillation signal frequency; and wherein the phase adjustment module further includes a plurality of sampling modules coupled to receive the oscillation signal, wherein each sampling module of the plurality of sampling modules samples the oscillation signal over a different time interval to produce a sampled voltage corresponding to a change in the period of the oscillation signal.

14. The VCO of claim 13 further including a variable low pass filter coupled to receive the sampled voltage from the plurality of sampling modules, wherein the variable low pass filter produces a filtered voltage representing a running average of the received sampled voltage.

15. The VCO of claim 14 further including a plurality of operational amplifiers, each operational amplifier coupled to receive, at a first input, the sampled voltage produced from each sampling module of the plurality of sampling modules, and coupled to receive the filtered voltage at a second input, and wherein each operational amplifier produces an output signal representing a difference between the received sampled voltage and the received filtered voltage.

16. The VCO of claim 15 wherein each operational amplifier is configured as a transconductance amplifier wherein the output signal is a current signal.

17. The VCO of claim 15 wherein each operational amplifier is configured as a voltage amplifier wherein the output signal is a voltage signal.

18. The VCO of claim 15 further including a summing module operably coupled to receive the output signals from each operational amplifier of the plurality of operational amplifiers and to produce therefrom the correction voltage.

19. The VCO of claim 18 further including a phase logic module for controlling operational characteristics of the phase adjustment module.

20. The VCO of claim 19 wherein the sampling module of the plurality of sampling modules further includes a sampling logic module operably coupled to receive the oscillation signal and operably coupled to receive at least one control signal from the phase logic module.

21. The VCO of claim 20 further including a variable current source serially coupled to a switch which is serially coupled to a capacitor, the variable current source for charging the capacitor during a specified time interval.

22. The VCO of claim 21 further including a sampling amplifier coupled to receive a capacitor voltage and to produce a sampled voltage corresponding to the period of the oscillation signal during the specified time interval.

23. The VCO of claim 22 wherein the sampling amplifier includes one of a fixed gain and a variable gain.

24. The VCO of claim 21 wherein the capacitor comprises a variable capacitor.

25. A method for producing an oscillation, comprising:

receiving a control voltage and producing an oscillation signal responsive to the control voltage;

sampling the oscillation signal over a plurality of different time intervals to produce a sampled voltage corresponding to a change in the period of the oscillation signal;

filtering the sampled voltage from the plurality of sampling modules and producing a filtered voltage representing a running average of the received sampled voltage;

reducing phase noise in the oscillation signal by producing a correction voltage to counteract a phase shift resulting from phase noise in the oscillation signal; and producing the correction voltage to adjust the oscillation signal.

26. The method of claim 25 further including producing a correction voltage representing a difference between the sampled voltage and the filtered voltage.

* * * * *